United States Patent
Kim et al.

(10) Patent No.: US 8,499,210 B2
(45) Date of Patent: Jul. 30, 2013

(54) FLASH MEMORY DEVICE, FLASH MEMORY SYSTEM, AND METHOD OF PROGRAMMING FLASH MEMORY DEVICE

(75) Inventors: Si-Hwan Kim, Hwaseong-si (KR);
Joon-Suc Jang, Hwaseong-si (KR);
Ki-Hwan Choi, Seongnam-si (KR);
Duck-Kyun Woo, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 345 days.

(21) Appl. No.: 12/943,369

(22) Filed: Nov. 10, 2010

(65) Prior Publication Data

US 2011/0145668 A1 Jun. 16, 2011

(30) Foreign Application Priority Data

Dec. 10, 2009 (KR) .................. 10-2009-0122584

(51) Int. Cl.
*H03M 13/00* (2006.01)

(52) U.S. Cl.
USPC ........................................... 714/746

(58) Field of Classification Search
USPC ............... 714/6.24, 6.3, 25, 30, 42, 54, 721, 714/746–754, 764–768, 774, 786, 799
See application file for complete search history.

(56) References Cited

U.S. PATENT DOCUMENTS

| 7,522,454 | B2 | 4/2009 | Li et al. | |
|---|---|---|---|---|
| 2004/0153902 | A1* | 8/2004 | Machado et al. | 714/710 |
| 2008/0137415 | A1* | 6/2008 | Lee | 365/185.03 |
| 2008/0158958 | A1* | 7/2008 | Sokolov et al. | 365/185.08 |
| 2009/0049364 | A1* | 2/2009 | Jo et al. | 714/763 |
| 2010/0058003 | A1* | 3/2010 | Goto et al. | 711/154 |
| 2010/0061151 | A1 | 3/2010 | Miwa et al. | |

FOREIGN PATENT DOCUMENTS

| KR | 1020080053779 A | 6/2008 |
|---|---|---|
| KR | 1020080113920 A | 12/2008 |

* cited by examiner

*Primary Examiner* — Nadeem Iqbal
(74) *Attorney, Agent, or Firm* — Volentine & Whitt, PLLC

(57) ABSTRACT

A flash memory device includes a plurality of memory cells each configured to store k-bit data, where k is a natural number greater than one. The device is programmed by a method including reading (i−1)-th order data from a selected memory cell connected to a selected wordline before programming i-th order data in one or more adjacent memory cells connected to an adjacent wordline, wherein i is a natural number between two and k, storing as read data the (i−1)-th order data read from the selected memory cell, and programming i-th order data in the selected memory cell based on the stored read data.

19 Claims, 7 Drawing Sheets

FLASH MEMORY DEVICE, FLASH MEMORY SYSTEM, AND METHOD OF PROGRAMMING FLASH MEMORY DEVICE

CROSS-REFERENCE TO RELATED APPLICATIONS

This application claims priority under 35 USC §119 to Korean Patent Application No. 10-2009-0122584 filed on Dec. 10, 2009, the disclosure of which is hereby incorporated by reference in its entirety.

BACKGROUND

Embodiments of the inventive concept relate generally to semiconductor memory devices. More particularly, embodiments of the inventive concept relate to flash memory devices comprising multi-level memory cells, flash memory systems incorporating the flash memory devices, and methods of programming the flash memory devices.

Semiconductor memory devices can be roughly divided into two categories based on whether or not they retain stored data when disconnected from power. These categories include nonvolatile memory devices, which retain stored data when disconnected from power, and volatile memory devices, which lose stored data when disconnected from power. Examples of nonvolatile memory devices include mask read-only memory (MROM), programmable read-only memory (PROM), erasable programmable read-only memory (EPROM), electrically erasable programmable read-only memory (EEPROM), and flash memory. Examples of volatile memory include dynamic random access memory (DRAM) and static random access memory (SRAM).

In recent years, increasing demand for high capacity data storage has led to the development of various types of nonvolatile memory that can store multiple bits of data per memory cell. Such memory cells are commonly referred to as multi-level memory cells. As examples, some flash memory devices have been developed with multi-level cells that store two bit data using four threshold voltage distributions corresponding to logic states "11", "01", "00", and "10", and some flash memory devices have been developed with multi-level cells that store three bit data using eight threshold voltage distributions. By contrast, single-level memory cells store one bit data using two threshold voltage distributions corresponding to logic states "1" and "0".

Memory cells that store more bits of data tend to have smaller distances between adjacent threshold voltage distributions compared with memory cells that store fewer bits of data. Consequently, a greater level of precision is generally required to distinguish between threshold voltage distributions of multi-bit memory cells compared with single-level memory cells. Moreover, in memory cells with smaller distances between adjacent threshold voltage distributions, electrical interference, such as coupling with adjacent memory cells, can cause adjacent threshold voltage distributions to overlap, which can cause read errors or other malfunctions.

SUMMARY

Embodiments of the inventive concept provide flash memory devices, flash memory systems, and methods of programming flash memory devices and systems. Some of these embodiments reduce read errors compared with conventional technologies.

According to one embodiment of the inventive concept, a method of programming a flash memory device is provided. The flash memory device comprises a plurality of memory cells each configured to store k-bit data, where k is a natural number greater than one. The method comprises reading (i−1)-th order data from a selected memory cell connected to a selected wordline before programming i-th order data in one or more adjacent memory cells connected to an adjacent wordline, wherein i is a natural number between two and k. The method further comprises storing as read data the (i−1)-th order data read from the selected memory cell, and programming i-th order data in the selected memory cell based on the stored read data.

In certain embodiments, the plurality of memory cells is configured to store k-bit data corresponding to first page data through k-th page data.

In certain embodiments, the read data comprises a bit corresponding to the first page data.

In certain embodiments, the read data comprises multiple bits corresponding to the first page data and the second page data, respectively.

In certain embodiments, the read data comprises multiple bits corresponding to the first page data through the (i−1)-th page data, respectively.

In certain embodiments, the read data is stored in the flash memory device.

In certain embodiments, the read data is stored externally with respect to the flash memory device.

In certain embodiments, the method further comprises, before programming the i-th order data, determining whether the read data has errors, and performing error correction on the read data based on the determination. The i-th order data is programmed in the selected memory cell based on the corrected read data.

In certain embodiments, the (i−1)-th order data is read from the selected memory cell before (i−1)-th order data is programmed in the adjacent memory cells connected to the adjacent wordline.

In certain embodiments, the error correction is performed while (i−1)-th order data is programmed into the adjacent memory cells.

In certain embodiments, the error correction is performed externally with respect to the flash memory device.

According to another embodiment of the inventive concept, a flash memory device comprises a cell array, a page buffer unit, a voltage generator, and a controller. The cell array comprises a plurality of memory cells each configured to store k-bit data, where k is a natural number greater than one. The page buffer unit is configured to perform read operations or program operations on selected memory cells. The voltage generator is configured to generate operating voltages for the read operations or program operations. The controller is configured to control the voltage generator and the page buffer unit such that (i−1)-th order data stored in a selected memory cell connected to a selected wordline is read before i-th order data is programmed into one or more adjacent memory cells connected to an adjacent wordline, where i is between two and k, and further configured to control the voltage generator and the page buffer unit such that the (i−1)-th order data is stored as read data, and i-th order data is stored in the selected memory cell based on the stored read data.

In certain embodiments, the flash memory device further comprises an error correction unit configured to perform error correction on the read data and further configured to provide corrected read data to the page buffer unit.

In certain embodiments, the page buffer unit comprises a plurality of latches that store the read data.

In certain embodiments, the error correction unit performs the error correction on the read data while (i−1)-th order data is programmed into the adjacent memory cells.

In certain embodiments, the cell array comprises a NAND flash cell array.

In certain embodiments, the (i−1)-th order data is read from the selected memory cell before (i−1)-th order data is programmed in the adjacent memory cells connected to the adjacent wordline.

According to another embodiment of the inventive concept, a memory system comprises a flash memory device and a memory controller. The flash memory device is configured to read (i−1)-th order data from a selected memory cell connected to a selected wordline before storing i-th order data in one or more adjacent memory cells connected to an adjacent wordline, and further configured to store as read data the (i−1)-th order data read from the selected memory cell, and to program i-th order data in the selected memory cell based on the read data, wherein the selected memory cell is configured to store k-bit data, where k is a natural number greater than one, and i is a natural number between two and k. The memory controller is configured to control the flash memory device.

In certain embodiments, the memory controller comprises an error correction unit configured to perform error correction on the read data, and the memory controller provides the corrected read data to the flash memory device.

In certain embodiments, the flash memory device is a NAND flash memory device.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, the terms first, second, third etc. are used to describe various elements; however, these elements should not be limited by these terms. Rather, these terms are used to distinguish one element from another. Thus, a first element discussed below could be termed a second element without departing from the teachings of the inventive concept. The term "and/or" encompasses any and all combinations of one or more of the associated listed items.

Where an element is referred to as being "connected" or "coupled" to another element, it can be directly connected or coupled to the other element or intervening elements may be present. In contrast, where an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing example embodiments and is not intended to be limiting of the inventive concept. The singular forms "a," "an" and "the" are intended to include the plural forms as well, unless the context clearly indicates otherwise. The terms "comprises," "comprising," "includes," and/or "including," where used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and will not be interpreted in an idealized or overly formal sense unless expressly so defined herein.

In some alternative implementations, the functions/acts noted may occur out of the order noted in the figures. For example, two figures shown in succession may in fact be executed substantially concurrently or may sometimes be executed in the reverse order, depending upon the functions/acts involved.

Figure 1:
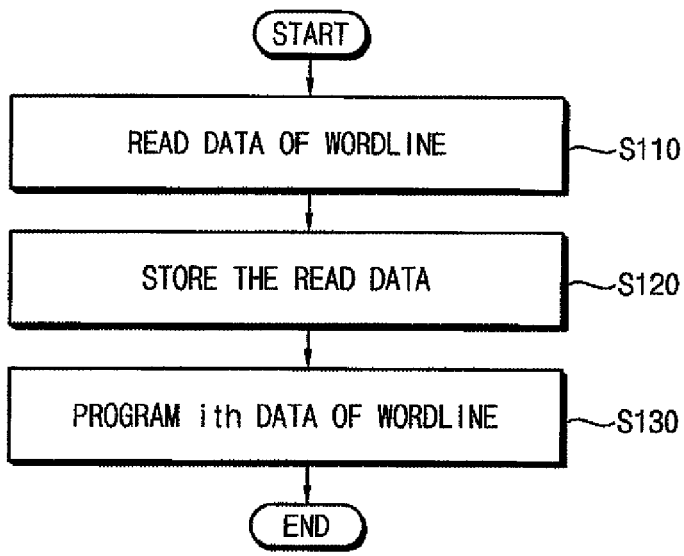
FIG. 1 is a flow chart illustrating a method of programming a flash memory device according to an embodiment of the inventive concept.

FIG. 1 is a flow chart illustrating a method of programming a flash memory device according to an embodiment of the inventive concept. The method is used to program memory cells that store k-bit data, where "k" is a natural number greater than one.

Referring to FIG. 1, the method comprises reading data from one or more selected memory cells connected to a selected wordline (S110). The data read from the selected memory cells is (i−1)-th order data, where "i" is a natural number between two and k. After the data is read from the selected memory cells, it is stored temporarily in the flash memory device or in an external device (S120). For instance, the data can be temporarily stored in latches of a page buffer in the flash memory device, or in an external device such as a flash memory controller.

Figure 2:
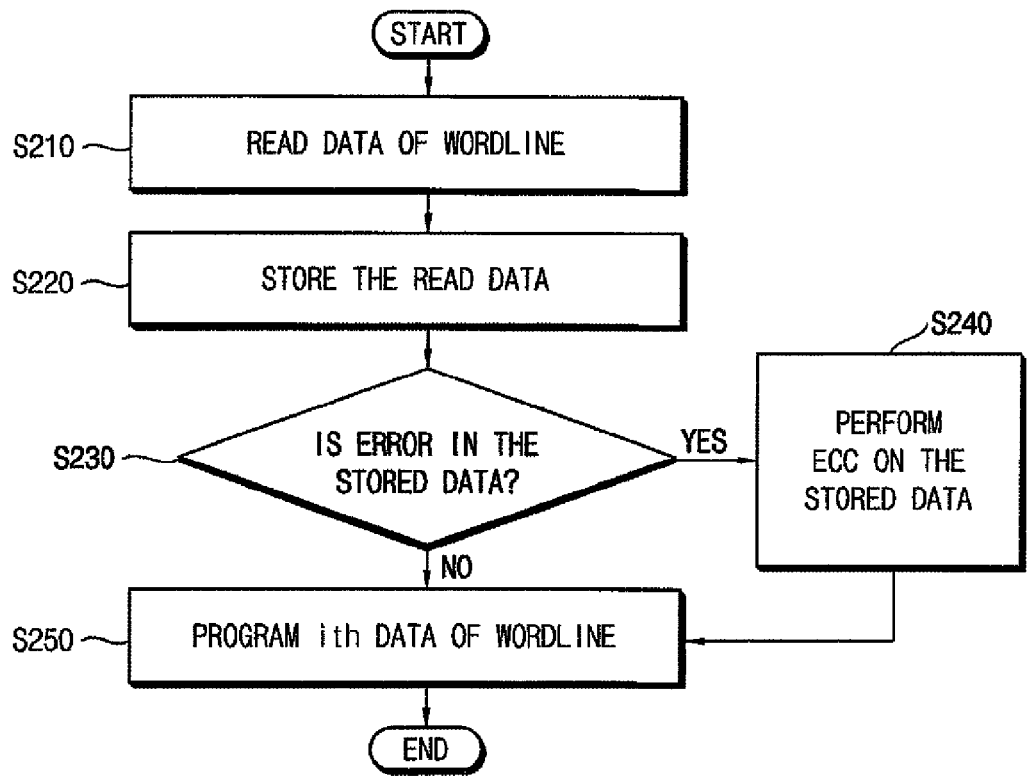
FIG. 2 is a flow chart illustrating a variation of the method of FIG. 1.

After the (i−1)-th order data is temporarily stored, i-th order data is programmed in the selected memory cells based on the temporarily stored data (S130). Before programming, the temporarily stored data can be analyzed to determine how to program the i-th order data in the selected memory cells. For instance, as illustrated by FIG. 2, the temporarily stored data can be analyzed using error correction codes to determine whether it has been distorted by electrical interference such as coupling with adjacent memory cells. If any distortion is detected in the (i−1)-th order data, appropriate measures can be taken to ensure that the i-th order data is properly stored in the selected memory cells. One example of such a measure is explained below with reference to FIG. 6.

In some embodiments, the (i–1)-th order data comprises a page of first-order data, such as a page of least significant bit (LSB) data. In some embodiments, the (i–1)-th order data comprises a page of higher-order data such as second or third order data. For instance, (i–1)-th order data comprises at least one bit of multiple bits corresponding to first through (i–1)-th bit of the k-bit data, respectively.

FIG. 2 is a flow chart illustrating a variation of the method of FIG. 1. In FIG. 2, steps S210, S220, and S250 correspond to steps S110, S120, and S130, respectively, of FIG. 1.

In the method of FIG. 2, temporarily stored (i–1)-th order data is analyzed to determine whether it contains any errors (S230). Where one or more errors is detected (S230=Yes), error correction is performed on the temporarily stored data (S240), and then i-th order data is programmed in the selected memory cells based on the error corrected data (S250). Otherwise (S230=No), i-th order data is programmed in the selected memory cells based on the temporarily stored data without error correction.

Figure 3:
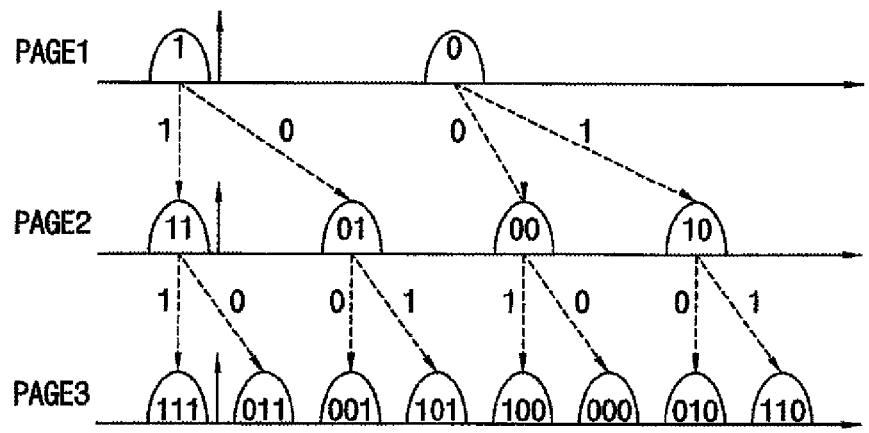
FIG. 3 is a diagram illustrating threshold voltage distributions of memory cells storing k-bit data according to an embodiment of the inventive concept.

FIG. 3 is a diagram illustrating threshold voltage distributions of memory cells storing k-bit data according to an embodiment of the inventive concept. For illustration purposes, FIG. 3 shows threshold voltage distributions of memory cells storing 3-bit data. However, embodiments of the inventive concept are not limited to 3-bit data.

In FIG. 3, threshold voltage distributions labeled "1" and "0" are achieved by a first page program operation PAGE1. First page program operation PAGE1 programs first order data in selected memory cells. The first order data can be, for instance, LSB data comprising a logical "1" or "0". In some embodiments, the threshold voltage distribution labeled "1" corresponds to an erased state of memory cells.

In FIG. 3, threshold voltage distributions labeled "11", "01", "00", and "10" are achieved by a second page program operation PAGE2. Second page program operation PAGE2 programs second order data in selected memory cells based on the first order data stored by the first page program operation PAGE1, as indicated by dotted arrows in FIG. 3. In particular, selected memory cells having the threshold voltage distribution labeled "1" are programmed to a threshold voltage distribution labeled "11" or "01", and selected memory cells having the threshold voltage distribution labeled "0" are programmed to a threshold voltage distribution labeled "00" or "10".

In FIG. 3, threshold voltage distributions labeled "111", "011", "001", "101", "100", "000", "010", and "110" are achieved by a third page program operation PAGE3. Third page program operation PAGE3 programs third order data in selected memory cells based on second order data stored by second page program operation PAGE2, as indicated by dotted arrows in FIG. 3. For instance, selected memory cells having the threshold voltage distribution labeled "11" are programmed to a threshold voltage distribution labeled "111" or "011", and so on. In certain embodiments, the third order data comprises most significant bit (MSB) data.

The threshold voltage distributions of the third page program operation PAGE3 are separated by relatively small margins. Accordingly, selected memory cells having these threshold voltage distributions can experience errors in response various forms of distortion. For instance, a selected memory cell in threshold voltage distribution "101" can be shifted to threshold voltage distribution "100" due to electrical coupling with adjacent memory cells when the adjacent memory cells are programmed. This can cause selected memory cells to be read erroneously. However, as will be explained with reference to FIG. 4, some of this distortion can be reduced by controlling the order of programming the selected memory cell and the adjacent memory cells.

Figure 4:
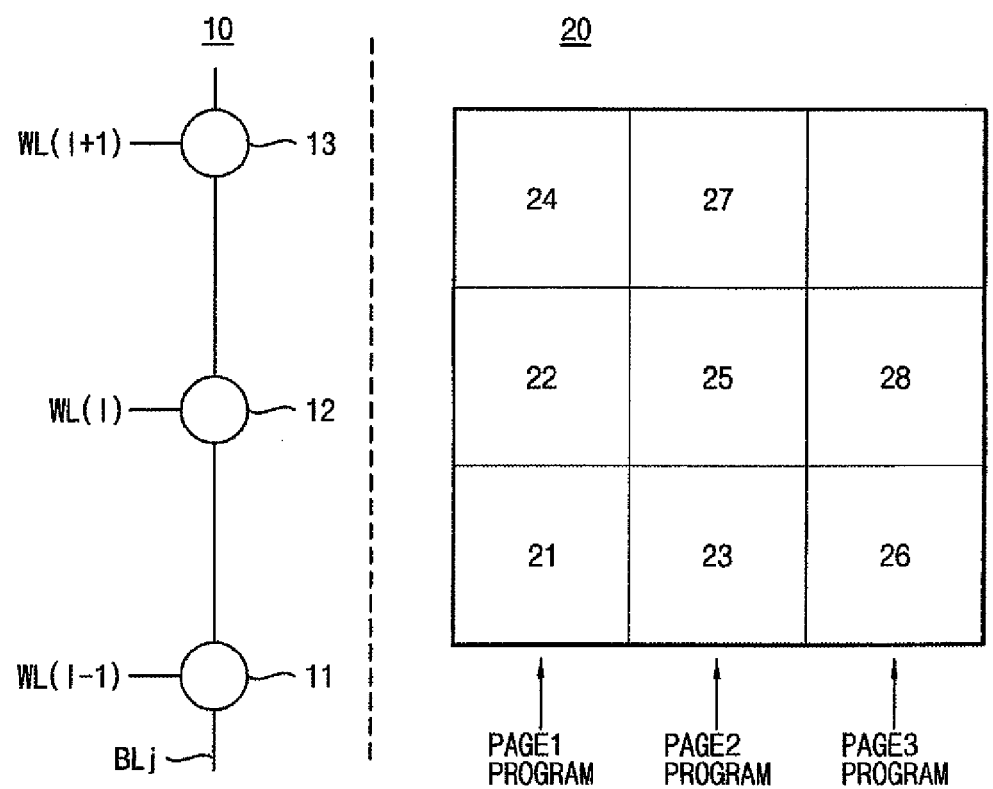
FIG. 4 is a diagram illustrating a sequence for programming k-bit data into a plurality of memory cells using the method of FIG. 1 or 2.

FIG. 4 is a diagram illustrating a sequence for programming k-bit data into a plurality of memory cells using the method of FIG. 1 or 2.

In FIG. 4 a reference number 10 indicates three of memory cells 11, 12 and 13 that are connected to a bitline BLj and respective wordlines WL(I–1), WL(I) and WL(I+1). A reference number 20 indicates a sequence of page program operations 21, 22, 23, 24, 25, 26, 27 and 28 that are performed on memory cells 11, 12 and 13. As illustrated in FIG. 4, the page program operations comprise first page program operations 21, 22 and 24, second page program operations 23, 25 and 27, and third sequences 26 and 28. Page program operations 21, 22, 23, 24, 25, 26, 27, 28 are performed according to their numerical order.

First page program operation 21 is performed to program a first bit (e.g., a LSB) of first data into memory cell 11. During the first page program operation 22, a first bit (e.g., a LSB) of second data is programmed in memory cell 12. During second page program operation 23, a second bit of the first data is programmed in memory cell 11. During first page program operation 24, a first bit (e.g., a LSB) of a third data is programmed in memory cell 13. During second page program operation 25, a second bit of the second data is programmed in memory cell 12.

In the programming sequence of FIG. 4, the threshold voltage distribution of memory cell 12 is distorted due to coupling effects with the first bit of memory cell 13 and the first and second bits of memory cell 11. Accordingly, before second page program operation 23 and/or first program operation 24 are performed, the first bit programmed in memory cell 12 is initially read and stored during an initial read operation (i.e., IRD) to address any effects of the coupling effect. Then, the second bit of the second data is programmed in memory cell 12 with reference to the initially read data. Because the initial read operation allows the second bit of the second data to be programmed with reference to the initially read data, it can reduce the effects of coupling effect between adjacent memory cells 11 and 13. Accordingly, the initial read operation allows the second data to be more precisely programmed in memory cell 12.

During third program operation 26, a third bit (e.g., MSB) of the first data is programmed in memory cell 11. During second program operation 27, a second bit of the third data is programmed in memory cell 13. During third program operation 28, a third bit of the second data is programmed in memory cell 12. Before the third page program operation 26 and/or second program operation 27 are performed, the first and second bits programmed in memory cell 12 are initially read and stored during an initial read operation. Then, the third bit of the second data is programmed in memory cell 12 with reference to the initially read data comprising a first and second page data. Accordingly, the second data of memory cell 12 is less affected by a coupling effect between the first and second bits of memory cell 13 and the first through third bits of memory cell 11 because the first and second page data of memory cell 12 is initially read and stored before the coupling effect influences the second data of memory cell 12. During third program operation 28, the third bit of the second data is programmed in memory cell 12 with reference to initially read data that is initially read from memory cell 12 before the third page program operation 26.

Figure 5:
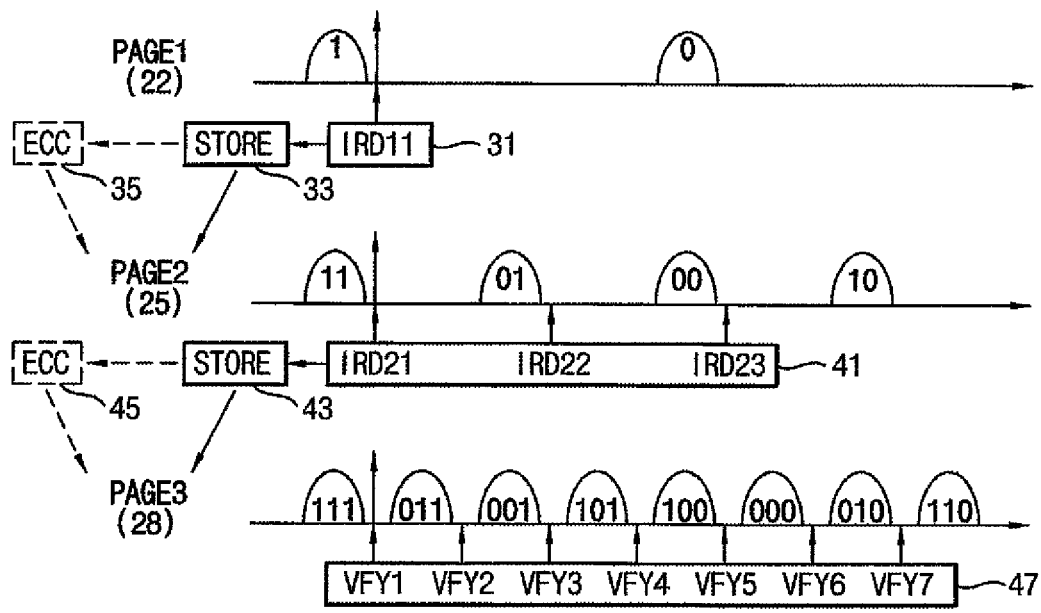
FIG. 5 is a diagram illustrating an example of the method of FIG. 1 or 2.

FIG. 5 is a diagram illustrating examples of the method of FIG. 1 or 2. In particular, FIG. 5 illustrates a process of programming a first bit (e.g., LSB) through a third bit (e.g., MSB) into selected memory cells and illustrates eight threshold voltage distributions (or states) of selected memory cells according to the first through third page program operations. During each of the first through third program operations, a bit is programmed into selected memory cells.

As illustrated in FIGS. 3 and 5, data is stored in memory cells using gray coding such that only one bit changes between successive threshold voltage distributions 111, 011, 001, 101, 100, 000, 010 and 110. Referring to FIG. 5, program operations for programming the second data into memory cell 12 comprise first page program operation 22 (PAGE1), second page program operation 25 (PAGE2) and the third page program operation 28 (PAGE3). During first page program operation 22 a first bit or first page of data is programmed; during second page program operation 25 a second bit or second page of data is programmed; and during third page program operation 28, a third bit or third page of data is programmed.

The first page data is programmed to memory cell 12 during the first page program operation 22. Before the second page program operation, an initial read operation 31 is performed to read the first page data of memory cell 12 using an initial read voltage IRD11. Then, the read data from memory cell 12 is stored during a store operation 33. Initial read operation 31 is performed before program operations 23 and/or 24 of FIG. 4 to reduce the effects of coupling between memory cell 12 and adjacent memory cells.

During second page program operation 25, the second page data is programmed to memory cell 12 with reference to the initially read data. Where the initially read data has been distorted before initial read operation 31, an error correction operation (ECC) 35 is performed on the initially read data using an error correction code. In this case, during second page program operation 25, the second page data is programmed to memory cell 12 based on a result of the error correction operation.

Before the third page program operation, an initial real operation 41 is performed to read the first and second page data of memory cell 12 using initial read voltages IRD21, IRD22 and IRD23. The read data from memory cell 12 is stored during a store operation 43. Initial read operation 41 is performed before program operations 26 and/or 27 of FIG. 4 to reduce the effects of coupling between memory cell 12 and adjacent memory cells. During third page program operation 28, the third page data is programmed to memory cell 12 with reference to the initially read data. Where the initially read data has been distorted before initial read operation 41, an error correction operation (ECC) 45 is performed on the initially read data using the error correction code. During third page program operation 28, the third page data is programmed to memory cell 12 based on a result of the error correction operation. In certain embodiments, the (i−1)-th order data is read from the selected memory cell 12 before (i−1)-th order data for the adjacent memory cell 13 are programmed in the adjacent memory cell 13 connected to the adjacent wordline WL(I+1).

A verification operation 47 performed after the third page program operation 28 determines whether the 3-bit data comprising the first, second and third page data is completely programmed into memory cell 12. Verification operation 47 is performed using verification voltages VFY1, VFY2, . . . , VFY7.

Figure 6:
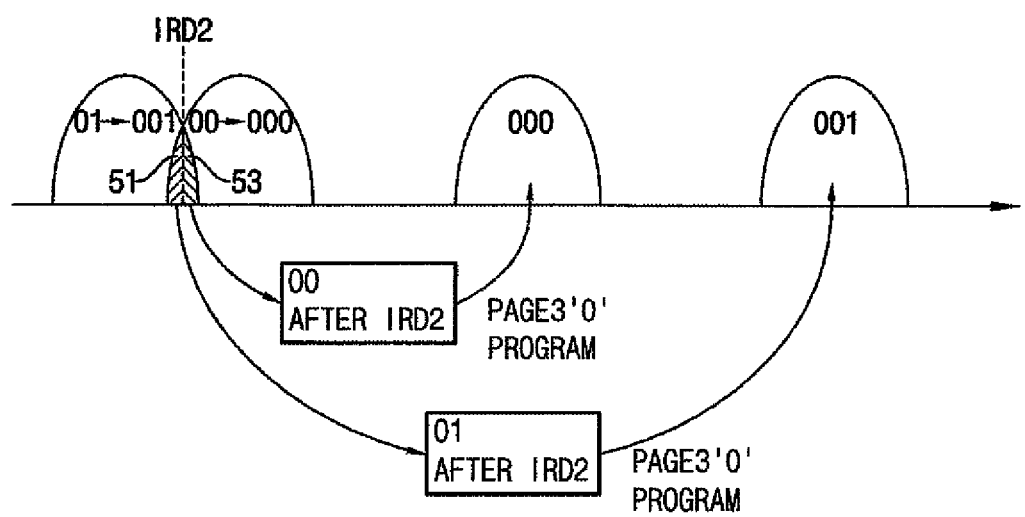
FIG. 6 is a diagram illustrating an error produced by a program operation.

FIG. 6 is a diagram illustrating examples of errors produced by a program operation. In particular, FIG. 6 shows threshold voltage distributions (or states) of "01" and "00" that are formed as a result of a second page program operation. The threshold voltage distributions "01" and "00" share overlapped regions 51 and 53 that are formed due to various effects such as electrical coupling. Where the third page data is "0", the threshold voltage distributions are reformed to generate threshold voltage distributions "001" and "000". Before the threshold voltage distributions are reformed, an initial read operation IRD2 is performed on memory cells of "01" and "00". Since the third page program operation is performed based on a result of the initial read operation IRD2, reliability of the third page program operation is decreased when accuracy of the initial read operation IRD2 is decreased.

As illustrated in FIG. 6, where the threshold voltage distributions overlap due to dispersion caused by various effects such as coupling, overlapped regions 51 and 53 can cause errors of the initial read data during initial read operation IRD2. Memory cells corresponding to overlapped region 51 should be recognized as a memory cell of the distribution of "00". However, during the initial read operation IRD2, the memory cells corresponding to overlapped region 51 are recognized as a memory cell of the distribution of "01". Thus, the initial read data is "01". Accordingly, although "000" is to be programmed into the memory cell when the third page data is "0", data "001" is programmed into the memory cell of which programmed voltage level is in overlapped region 51.

Similarly, although "100" is to be programmed into the memory cell where the third page data is "1", data "101" is programmed into the memory cell of which programmed voltage level is in overlapped region 51. As such, memory cells corresponding to overlapped region 53 should be recognized as a memory cell of the distribution of "01". However, during the initial read operation IRD2, the memory cells corresponding to overlapped region 53 are recognized as a memory cell of the distribution of "00". Thus, the initial read data is "00". Accordingly, although "001" is a correct data for the memory cell when the third page data is "0", data "000" is programmed into the memory cell of which programmed voltage level is in overlapped region 53.

Similarly, although "101" is correct data for the memory cell where the third page data is "1", data "100" is programmed into the memory cell of which programmed voltage level is in overlapped region 53. As described with reference to FIG. 6, dispersion of threshold voltage distributions may cause such errors during the initial read operations.

Such errors may occur because the initial operation is performed after a memory cell to be programmed is affected by coupling effect between adjacent memory cells. One bit error during the initial read operation is accumulated over the program operations that are additionally performed on the memory cell to program other bits. Although the above description explains errors due to the coupling between adjacent memory cells, other errors of the initial read operation can occur due to various causes such as signal noise during the initial read operation.

As described above, data errors that occur in program operations can be reduced by performing an initial read operation before selected memory cells are affected by coupling with adjacent wordlines. Moreover, read data obtained by the initial read operation can be corrected to reduce errors due to various causes, and program operations for remaining bits can be performed with reference to the corrected initial read data. For convenience of explanation, various embodiments are described with 3-bit multi-level cells. However, the number of bits in the multi-level cells can be modified in other embodiments.

Figure 7:
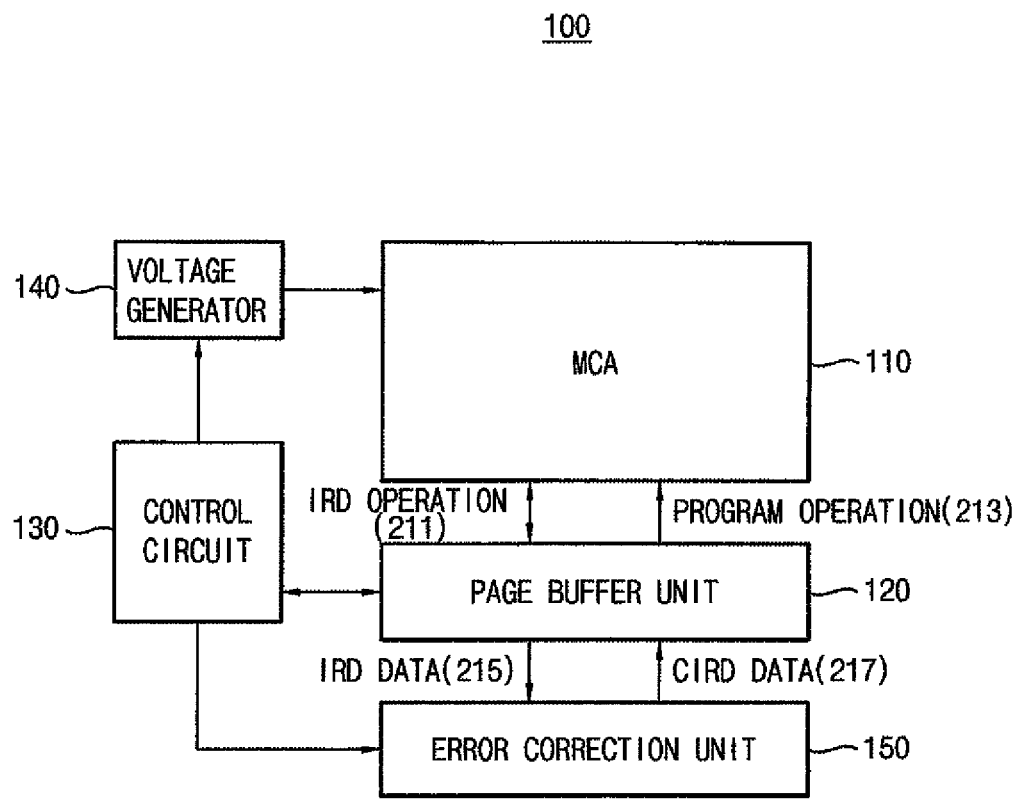
FIG. 7 is a block diagram illustrating a flash memory device according to an embodiment of the inventive concept.

FIG. 7 is a block diagram illustrating a flash memory device 100 according to an embodiment of the inventive concept.

Referring to FIG. 7, flash memory device 100 comprises a cell array 110, a page buffer unit 120, a voltage generator 140, a controller 130, and an error correction unit 150.

Cell array 110 comprises a plurality of memory cells. Each of the memory cells stores a k-bit, where k is a natural number larger than one. Each of the memory cells is connected to a wordline and a bitline.

Page buffer unit 120 performs read operations and program operations on selected memory cells that are connected to a selected wordline. Page buffer unit 120 operates as a write driver or a sense amplifier according to different operation modes. For example, page buffer unit 120 operates as a write driver during a program operation mode and as a sense amplifier during a read operation mode. Page buffer unit 120 performs an initial read operation 211 to read a programming status (i.e., bits of programmed data) of the selected memory cell, and stores initial read data as a result of initial read operation 211. Initial read operation 211 is performed before a program operation 213 is performed to read data from the selected memory cell.

Page buffer unit 120 is connected to bitlines and comprises page buffers that are capable of temporarily storing initial read data. Each of the page buffers comprises a plurality of latches that are connected to a corresponding bitline of the bitlines. Each of the latches temporarily stores a corresponding bit of the initial read data.

Because the initial read data possibly contains errors, page buffer unit 120 can latch an error correction code (e.g., parity bits) to be used for an error correction operation. Thus, in some embodiments, where the initial data comprises errors, error correction unit 150 receives initial read data IRD DATA 215 and the error correction code. Error correction unit 150 performs error correction on the initial read data to detect and correct the errors included in the initial read data. Error corrected initial read data CIRD DATA is provided to page buffer unit 120. Page buffer unit 120 performs a program operation on the selected memory cell with reference to initial read data IRD DATA or error corrected initial data CIRD DATA. In some embodiments, operations for detecting and correcting the initial read data and providing the error corrected initial read data to page buffer unit 120 are performed before a page of data is programmed into adjacent memory cells connected to adjacent wordlines.

In the example of FIG. 7, error correction unit 150 is included in flash memory device 100. Alternatively, as in the example of FIG. 10, error correction unit 150 can be included in a memory controller 200 located external to flash memory device 100.

Voltage generator 140 generates operating voltages for the read operations or program operations. The operating voltages can include, for instance, program voltages, pass voltages, verification voltages, initial read voltages, and normal read voltages. In some embodiments, the program voltages are incremental step pulse program (ISPP) voltages.

Controller 130 controls voltage generator 140 and page buffer unit 120 such that data programmed in memory cells connected to a selected wordline is read before bits are programmed into adjacent memory cells, where the adjacent memory cells are connected to at least one wordline adjacent to the selected wordline. Each of the bits is an i-th bit or a preceding bit that is to be programmed in each of the adjacent memory cells. Controller 130 controls voltage generator 140 and page buffer unit 120 such that the read data of the memory cell is stored and an i-th bit of the k-bit data is programmed into the memory cell by referring to the read data. Controller 130 can control voltage generator 140 to apply the program voltages, the initial read voltages, and the verification voltages to the selected wordline during the program operation mode and to apply the pass voltages to unselected wordlines. In some embodiments, controller 130 controls error correction unit 150 to perform the error correction, as described above. Error correction unit 150 can perform the error correction on the read data while the (i−1)-th bits are programmed into the adjacent memory cells.

Figure 8:
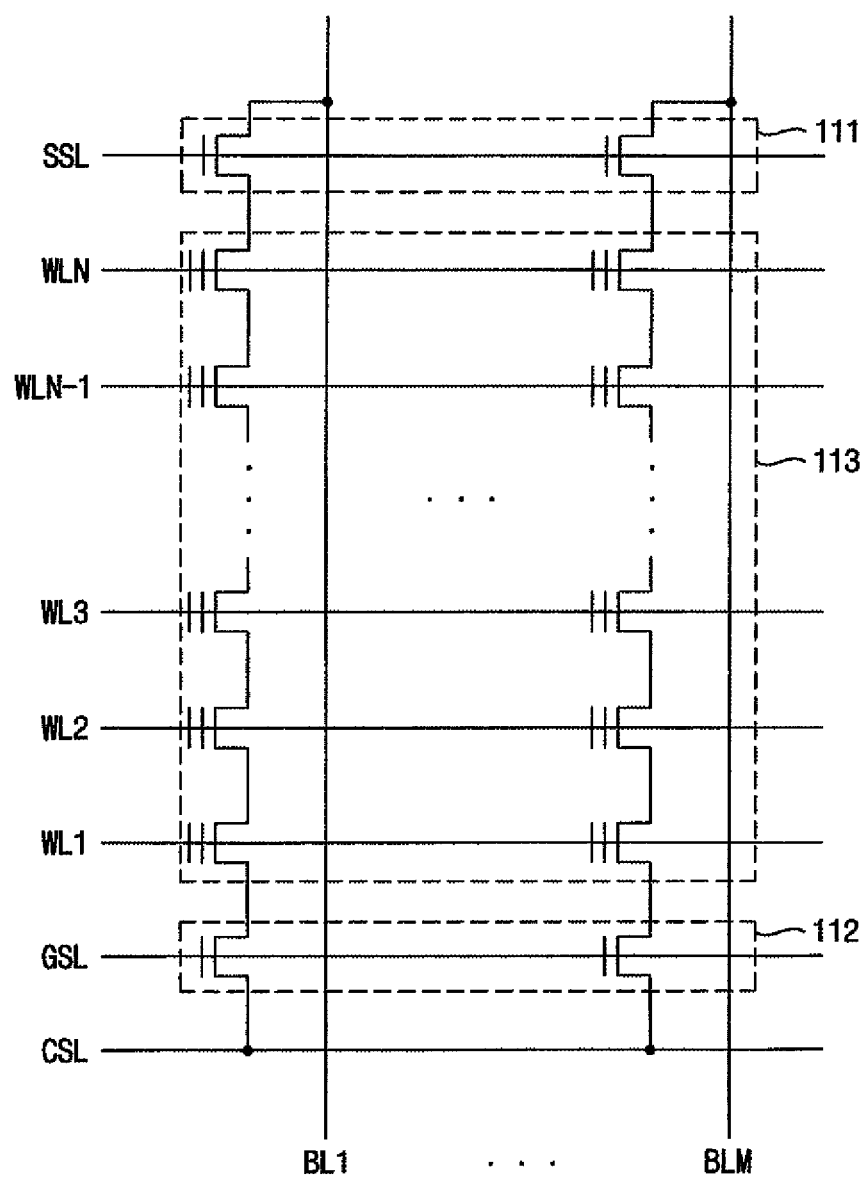
FIG. 8 is a block diagram illustrating a memory cell array in the flash memory device of FIG. 7.

FIG. 8 is a block diagram illustrating an example of memory cell array 110 in the flash memory device of FIG. 7. In the example of FIG. 8, memory cell array 110 comprises string selection transistors 111, ground selection transistors 112, and memory cells 113.

String selection transistors 111 are connected to bitlines BL1, . . . , BLM, and ground selection transistors 112 are connected to a common source line (CSL). Memory cells 113 are connected in series between respective string selection transistors 111 and respective ground selection transistors 112. Memory cells are arranged in a matrix of rows and columns, and memory cells located in the same row may share a corresponding wordline among wordlines WL1, WL2, WL3, . . . , WLN−1, WLN. String selection transistors 111 are controlled using voltages applied via a string selection line (SSL), and ground selection transistors 112 are controlled using voltages applied via a ground selection line (CSL). Memory cells 113, each of which has multiple threshold voltage levels to store multi-bit data, are controlled using voltages applied via respective wordlines WL1, WL2, WL3, . . . , WLN−1, WLN. For example, k-bit data is programmed into memory cells 113. In the example of FIG. 8, flash memory device 100 is assumed to comprise a NAND flash memory. However, the inventive concept is not limited to NAND flash memory device.

Figure 9:
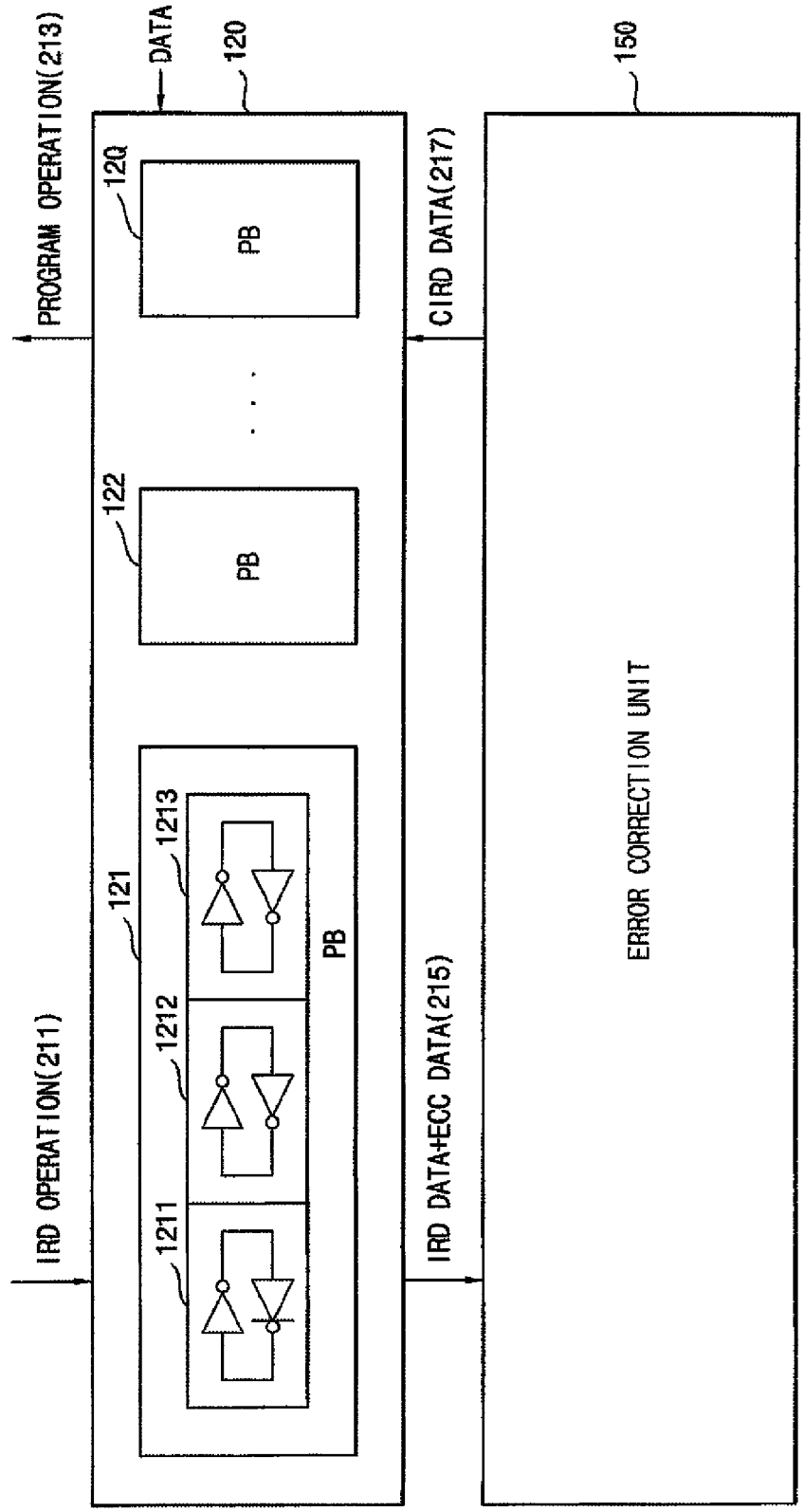
FIG. 9 is a diagram illustrating a page buffer unit and an error correction unit in the flash memory device of FIG. 7.

FIG. 9 is a diagram illustrating an example of page buffer unit 120 and error correction unit 150 of FIG. 7. In the example of FIG. 9, page buffer unit 120 comprises page buffers 121, 122, . . . , 12Q and each of the page buffers comprises a plurality of latches 1211, 1212, and 1213. For convenience of explanation, read or program operations for one memory cell will be described with reference to FIG. 9, but such operations can be performed in page units (e.g., 2K bytes) by similarly controlling page buffers 121, 122, . . . , 12Q during a similar operation. The number of page buffers 121, 122, . . . , 12Q, is typically less than or equal to N, which is the number of wordlines in memory cell array 110.

Initial read operation 211 is performed to detect states of threshold voltage distributions of memory cells 113. Initial read data comprising information about states of the threshold voltage distributions can be read from the memory cells during the initial read operations as described with reference to FIGS. 4, 5 and 7. The initial read data IRD DATA is stored in the respective page buffers, each of which comprises at least one of latches 1211, 1212 and 1213. Where initial read operation 211 is performed for the second page operation, initial read data IRD DATA produced by initial read operation 211 comprises one bit data, which can be stored using one latch (e.g., latch 1211) of latches 1211, 1212 and 1213. Where initial read operation 211 is performed for the third page operation, initial read data IRD DATA produced as a result of initial read operation 211 can comprise two bit data, which can be stored using two latches (e.g., latch 1211 and 1212) of latches 1211, 1212 and 1213.

Additionally, during initial read operation 211, error correction code data ECC DATA is read (215) from a portion of memory cell array 110, for example, a spare portion of memory cell array 110. Error correction code data ECC DATA is stored in an unoccupied portion of page buffers. Error correction unit 150 receives initial read data IRD DATA and error correction code data ECC DATA from page buffer unit 120, and detects and corrects errors of the initial read data IRD DATA with reference to the error correction code data ECC DATA. Corrected initial read data CIRD DATA is stored (217) into corresponding latches of the page buffer units. Accordingly, initial read data IRD DATA is replaced with the corrected initial read data CIRD DATA. Moreover, according to whether errors of the initial read data IRD DATA have been detected, the corrected initial read data CIRD can be a corrected or non-corrected data. For example, where errors are not detected in initial read data IRD DATA, corrected initial read data CIRD DATA can be the same as initial read data IRD DATA. Page data for program operation of a memory cell is stored in at least one latch (e.g., latch 1213) among latches 1211, 1212 and 1213.

A program operation (213) is performed on memory cell 110 by a program controller after the page data and the corrected initial data CIRD DATA are stored in page buffer unit 120.

As described above, in some embodiments, errors of program operations can be reduced by performing an initial read operation on selected memory cells connected to selected wordlines before performing program operations on memory cells that are connected to adjacent wordlines.

Figure 10:
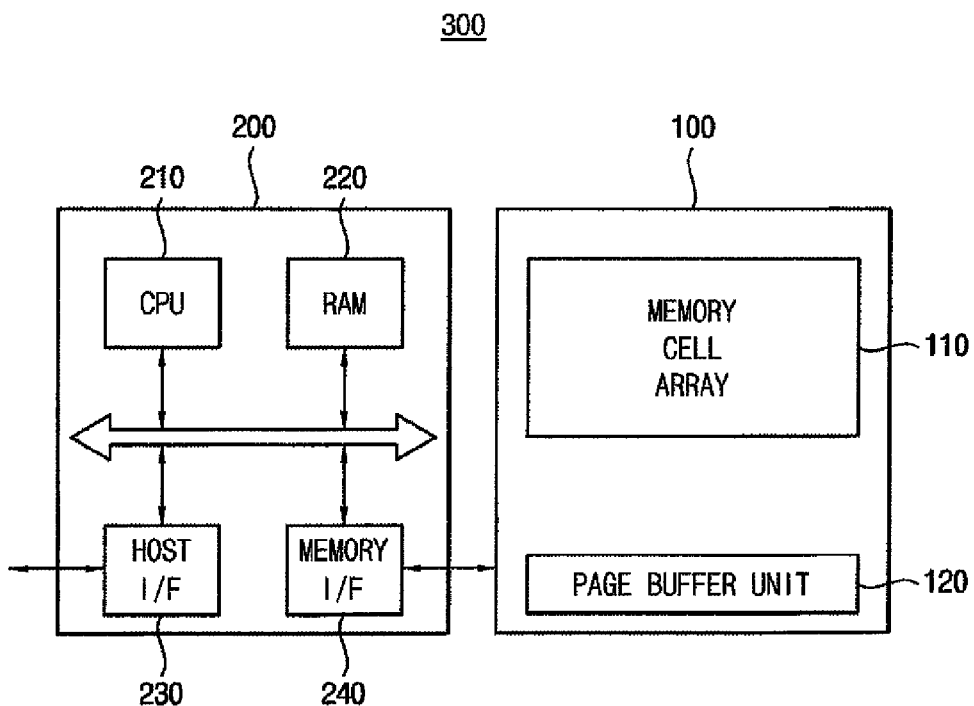
FIG. 10 is a block diagram illustrating a flash memory system incorporating the flash memory device of FIG. 7.

FIG. 10 is a block diagram illustrating a flash memory system 300 comprising flash memory device 100 of FIG. 7.

Referring to FIG. 10, memory system 300 comprises flash memory device 100 and a memory controller 200.

Flash memory device 100 comprises memory cell array 110 and page buffer unit 120. Page buffer unit 120 comprises page buffers connected to respective bitlines, and each of the page buffers stores initial read data IRD DATA. Memory cell array 110 comprises a plurality of memory cells connected to wordlines and the bitlines.

Memory controller 200 controls flash memory device 100. Memory controller 200 controls data exchanges between an external host and flash memory device 100. Memory controller 200 comprises a central processing unit (CPU) 210, a buffer memory (RAM) 220, a host interface (HOST I/F) 230 and a memory interface (MEMORY I/F) 240. Central processing unit 210 performs operations for the data exchanges. Host interface 230 is connected to the external host, and memory interface 240 is connected to flash memory device 100. Central processing unit 210 communicates with the external host via host interface 230. Central processing unit 210 controls flash memory device 100 via memory interface 240.

Memory controller 200 comprises an error correction unit. The error correction unit performs error correction on the read data. Memory controller 200 provides the corrected read data to flash memory device 100.

In some embodiments, memory controller 200 further comprises a nonvolatile memory device storing start-up code. Memory controller 200 further comprises an error correction block. Buffer memory (RAM) 220 can comprise, for instance, dynamic random access memory (DRAM), static random access memory (SRAM), phase change random access memory (PRAM), ferroelectric random access memory (FRAM), resistive random access memory (RRAM), or magnetic random access memory (MRAM). Buffer memory (RAM) 220 provides storage for operations of central processing unit 210.

Host interface 230 can communicates with external devices such as the external host using one of various interface protocols such as universal serial bus (USB), multi-media card (MMC), peripheral component interconnect (PCI), serial advanced technology attachment (SATA), parallel advanced technology attachment (PATA), small computer system interface (SCSI), enhanced small disk interface (ESDI), or integrated drive electronics (IDE).

Flash memory device 100 and/or memory controller 200 can be packaged in various types of package configurations, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline package (TSOP), system in package (SIP), multi chip package (MCP), wafer-level fabricated package (WFP), or wafer-level processed stack package (WSP). Memory cells of flash memory device 100 can be multi level cells (MLC) comprising charge storing layers and thus may have various cell structures such as charge trap flash (CTF) structure comprising charge trap layers, stack flash structure in which multiple memory arrays are stacked, flash structure without source and drain, pin type flash structure, etc.

Figure 11:
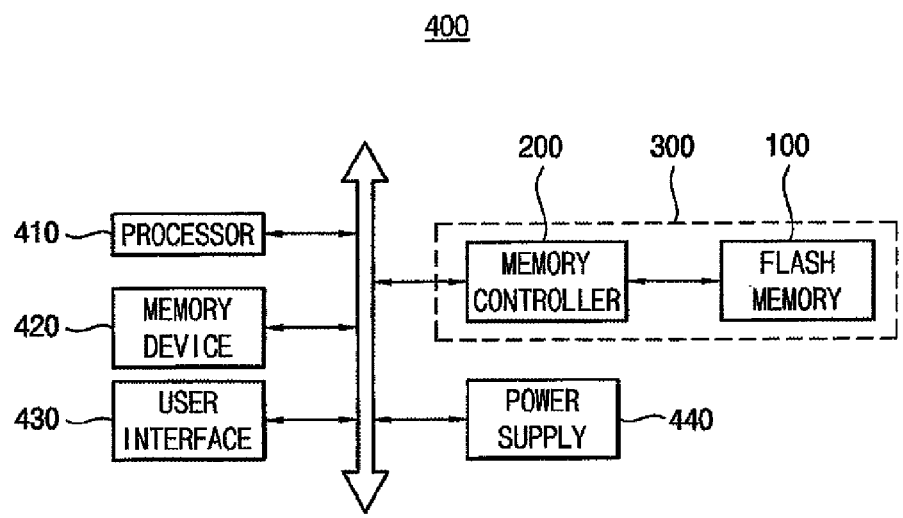
FIG. 11 is a block diagram illustrating a computing system incorporating the flash memory system of FIG. 10.

FIG. 11 is a block diagram illustrating a computing system 400 comprising flash memory system 300 of FIG. 10.

Referring to FIG. 11, computing system 400 comprises a processor 410, a memory device 420, a user interface 430, and flash memory system 300.

Processor 410 performs various computing functions, such as executing software for performing specific calculations or tasks. Processor 410 can comprise, for instance, a microprocessor or a central process unit (CPU). Processor 410 is connected to memory device 420 via a bus, such as an address bus or a control bus or a data bus. Memory device 420 can comprise, for instance, a dynamic random access memory (DRAM), a static random access memory (SRAM), or a nonvolatile memory, such as an erasable programmable read-only memory (EPROM), an electrically erasable programmable read-only memory (EEPROM), or a flash memory. Processor 410 can be connected to an expansion bus, such as peripheral component interconnect (PCI) bus. Processor 410 typically controls one or more input/output devices, such as a keyboard, a mouse, a printer, or a display device. Computing system 400 typically further comprises a storage device, such as a floppy disk drive, a compact disk read-only memory (CD-ROM) drive, or a hard disk drive. Processor 410 controls user interface 430, which can comprise, for instance, an input device (e.g., a keyboard or a mouse), an output device (e.g., a printer or a display device), or a storage device (e.g., a hard disk drive or a compact disk read-only memory (CD-ROM)). Flash memory device 100 stores multi bit data that is provided via user interface 430 or provided from processor 410. Computing system 400 further comprises a power supply 440 for supplying operational power. Computing system 400 can further comprise an application chipset, a camera image processor (CIS), and a mobile DRAM.

In various alternative embodiments, computing system 400 can comprise any of several types of electronic devices, such as a cellular phone, a personal digital assistant (PDA), a digital camera, a portable game console, a MP3 player, a desktop computer, a laptop or notebook computer, a digital speaker, a video player, a television, and others.

As indicated by the foregoing, certain embodiments of the inventive concept can reduce accumulation and spreading of data errors in multi-level memory cells by controlling the timing of initial read operations. Moreover, these devices, systems, and methods can reduce operational overhead by performing error correction on selected memory cells while program operations are performed on other memory cells adjacent to the selected memory cells.

Many of the above-described embodiments can be employed in different types of data storing devices or computing systems comprising multi-level cells. Moreover, certain embodiments can be employed in semiconductor devices such as flash memory devices, memory cards, solid state drives, cellular phones, personal digital assistants (PDAs), digital cameras, portable game consoles, MP3 players, desktop computers, laptops or notebook computers, digital speakers, video players, televisions, and others.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a flash memory device comprising a plurality of memory cells each configured to store k-bit data, where k is a natural number greater than one, the method comprising:
reading (i−1)-th order data from a selected memory cell connected to a selected wordline before programming i-th order data in one or more adjacent memory cells connected to an adjacent wordline, wherein i is a natural number between two and k;
storing as read data the (i−1)-th order data read from the selected memory cell; and
programming i-th order data in the selected memory cell based on the stored read data,
wherein the (i−1)-th order data is read from the selected memory cell before (i−1)-th order data is programmed in the adjacent memory cells connected to the adjacent wordline.

2. The method of claim 1, wherein the plurality of memory cells are configured to store k-bit data corresponding to first page data through k-th page data.

3. The method of claim 2, wherein the read data comprises a bit corresponding to the first page data.

4. The method of claim 2, wherein the read data comprises multiple bits corresponding to the first page data and the second page data, respectively.

5. The method of claim 2, wherein the read data comprises multiple bits corresponding to the first page data through the (i−1)-th page data, respectively.

6. The method of claim 1, wherein the read data is stored in the flash memory device.

7. The method of claim 1, wherein the read data is stored externally with respect to the flash memory device.

8. The method of claim 1, further comprising:
before programming the i-th order data, determining whether the read data has errors; and
performing error correction on the read data based on the determination, and
wherein the i-th order data is programmed in the selected memory cell based on the corrected read data.

9. The method of claim 8, wherein the error correction is performed while (i−1)-th order data is programmed into the adjacent memory cells.

10. The method of claim 8, wherein the error correction is performed externally with respect to the flash memory device.

11. A flash memory device comprising:
a cell array comprising a plurality of memory cells each configured to store k-bit data, where k is a natural number greater than one;
a page buffer unit configured to perform read operations or program operations on selected memory cells;
a voltage generator configured to generate operating voltages for the read operations or program operations; and
a controller configured to control the voltage generator and the page buffer unit such that (i−1)-th order data stored in a selected memory cell connected to a selected wordline is read before i-th order data is programmed into one or more adjacent memory cells connected to an adjacent wordline, where i is between two and k, and further configured to control the voltage generator and the page buffer unit such that the (i−1)-th order data is stored as read data, and i-th order data is stored in the selected memory cell based on the stored read data,
wherein the (i−1)-th order data is read from the selected memory cell before (i−1)-th order data is programmed in the adjacent memory cells connected to the adjacent wordline.

12. The flash memory device of claim 11, further comprising:
an error correction unit configured to perform error correction on the read data and further configured to provide corrected read data to the page buffer unit.

13. The flash memory device of claim 12, wherein the page buffer unit comprises a plurality of latches that store the read data.

14. The flash memory device of claim 12, wherein the error correction unit performs the error correction on the read data while (i−1)-th order data is programmed into the adjacent memory cells.

15. The flash memory device of claim 12, wherein the cell array comprises a NAND flash cell array.

16. A memory system, comprising:
a flash memory device configured to read (i−1)-th order data from a selected memory cell connected to a selected wordline before storing i-th order data in one or more adjacent memory cells connected to an adjacent wordline, and further configured to store as read data the (i−1)-th order data read from the selected memory cell, and to program i-th order data in the selected memory cell based on the read data, wherein the selected memory cell is configured to store k-bit data, where k is a natural number greater than one, and i is a natural number between two and k; and
a memory controller configured to control the flash memory device,
wherein the (i−1)-th order data is read from the selected memory cell before (i−1)-th order data is programmed in the adjacent memory cells connected to the adjacent wordline.

17. The memory system of claim 16, wherein the memory controller comprises an error correction unit configured to perform error correction on the read data, and wherein the memory controller provides the corrected read data to the flash memory device.

18. The memory system of claim 16, wherein the flash memory device is a NAND flash memory device.

19. A method of programming a flash memory device comprising a plurality of memory cells each configured to store k-bit data, where k is a natural number greater than one, the method comprising:
  programming first page data in selected memory cells connected to a selected wordline; then
  reading the first page data in selected memory cells connected to the selected wordline before programming second page data in one or more adjacent memory cells connected to an adjacent upper wordline; then
  storing as read data the first page data read from the selected memory cells; then
  programming the second page data in the one or more adjacent memory cells; and then
  programming the first page data read from the selected memory cell and third page data in the selected memory cell.

* * * * *